(12) United States Patent
Venkatraman et al.

(10) Patent No.: US 11,374,669 B2
(45) Date of Patent: Jun. 28, 2022

(54) PHASE SPECTRUM BASED DELAY ESTIMATION METHOD AND MODULE

(71) Applicant: TEXAS INSTRUMENTS INCORPORATED, Dallas, TX (US)

(72) Inventors: Sashidharan Venkatraman, Bengaluru (IN); Jawaharlal Tangudu, Bengaluru (IN); Sarma Sundareswara Gunturi, Bengaluru (IN); Yeswanth Guntupalli, Guntur (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 332 days.

(21) Appl. No.: 16/593,401

(22) Filed: Oct. 4, 2019

(65) Prior Publication Data

US 2020/0169342 A1     May 28, 2020

Related U.S. Application Data

(60) Provisional application No. 62/786,504, filed on Dec. 30, 2018.

(30) Foreign Application Priority Data

Nov. 28, 2018  (IN) .............................. 201841044816

(51) Int. Cl.
*H04B 17/364* (2015.01)
*H03C 3/40* (2006.01)
*H04L 25/03* (2006.01)

(52) U.S. Cl.
CPC ............. *H04B 17/364* (2015.01); *H03C 3/40* (2013.01); *H04L 2025/0342* (2013.01)

(58) Field of Classification Search
CPC ........ H04B 17/364; H04B 17/21; H03C 3/40; H04L 2025/0342; H04L 27/3863
See application file for complete search history.

(56) References Cited

U.S. PATENT DOCUMENTS

| | | | |
|---|---|---|---|
| 7,020,226 B1 | 3/2006 | Kirkland | |
| 8,204,102 B2 | 6/2012 | O'Leary et al. | |
| 8,923,110 B2* | 12/2014 | Cheng ....................... | H04L 1/20 370/210 |
| 10,097,396 B2 | 10/2018 | Sestok, IV | |
| 10,382,087 B1 | 8/2019 | Dror et al. | |
| 10,484,108 B1 | 11/2019 | Al-Qaq | |
| 10,623,121 B1* | 4/2020 | Satrasala ............... | H04B 17/364 |
| 2004/0203472 A1 | 10/2004 | Chien | |
| 2004/0218522 A1 | 11/2004 | Sundstrom et al. | |
| 2005/0220056 A1 | 10/2005 | Itoh | |
| 2006/0203710 A1 | 9/2006 | Mukkavilli et al. | |
| 2008/0025381 A1 | 1/2008 | Lee et al. | |
| 2008/0075190 A1 | 3/2008 | Lin | |
| 2008/0212662 A1 | 9/2008 | Lee et al. | |
| 2010/0027689 A1 | 2/2010 | Kohlmann | |
| 2010/0135449 A1 | 6/2010 | Row et al. | |

(Continued)

*Primary Examiner* — Jean B Corrielus
(74) *Attorney, Agent, or Firm* — John R. Pessetto; Charles A. Brill; Frank D. Cimino

(57) ABSTRACT

A phase spectrum based delay estimating method of tracking channel responses, extracting phase responses from the tracked channel responses, and generating a delay estimate, wherein the delay estimate is based on a slope and intercept estimates of the extracted phase responses with high quality metric to improve delay estimation, and a system thereof.

25 Claims, 9 Drawing Sheets

(56) References Cited

U.S. PATENT DOCUMENTS

| | | |
|---|---|---|
| 2010/0232493 A1 | 9/2010 | Thirumoorthy |
| 2010/0313094 A1 | 12/2010 | Kubota |
| 2010/0330929 A1 | 12/2010 | Heutmaker et al. |
| 2011/0051790 A1 | 3/2011 | Honda |
| 2011/0069744 A1 | 3/2011 | Laudel et al. |
| 2011/0182374 A1* | 7/2011 | Primo ................ H04B 17/345 375/260 |
| 2012/0115412 A1 | 5/2012 | Gainey et al. |
| 2012/0250790 A1 | 10/2012 | Yang et al. |
| 2012/0263215 A1 | 10/2012 | Peng |
| 2012/0300818 A1 | 11/2012 | Metreaud et al. |
| 2012/0328041 A1 | 12/2012 | Chen et al. |
| 2013/0058387 A1 | 3/2013 | Muhammad |
| 2013/0058388 A1 | 3/2013 | Muhammad et al. |
| 2013/0195152 A1 | 8/2013 | Muhammad |
| 2013/0208770 A1 | 8/2013 | Muhammad et al. |
| 2013/0208827 A1 | 8/2013 | Muhammad et al. |
| 2013/0281028 A1 | 10/2013 | Sun |
| 2014/0092947 A1 | 4/2014 | Reial |
| 2015/0030060 A1* | 1/2015 | Kyosti ............... H04B 17/0087 375/224 |
| 2015/0094082 A1 | 4/2015 | Gupta et al. |
| 2015/0229497 A1 | 8/2015 | Dhayni |
| 2016/0182162 A1 | 6/2016 | Belitzer et al. |
| 2016/0323010 A1 | 11/2016 | Wu et al. |
| 2016/0359614 A1 | 12/2016 | Hao et al. |
| 2017/0264477 A1 | 9/2017 | Qu |
| 2019/0036749 A1 | 1/2019 | Erez et al. |
| 2020/0028500 A1 | 1/2020 | Cheng et al. |

\* cited by examiner

PHASE SPECTRUM BASED DELAY ESTIMATION METHOD AND MODULE

RELATED APPLICATIONS

This application claims priority to Indian Provisional Application No. 201841044816, filed Nov. 28, 2018, and U.S. Provisional Application No. 62/786,504, filed on Dec. 30, 2018, which are hereby incorporated by reference.

BACKGROUND

Zero-IF transmitter employs homodyne or direct up-conversion to transmit a pair of quadrature signals, i.e., signals that differ in phase by 90 degrees. The reference signal of the pair of quadrature signals, which is "in-phase," is referred to as I signal. The signal that is shifted 90 degrees, and is in "quadrature" phase, is referred to as Q signal. During the homodyne up-conversation, the I and Q baseband signals are mixed with the in-phase and quadrature-phase components of a local oscillator (LO) signal to generate I and Q radio frequency (RF) signals for transmission.

During a direct up-conversion, it is important to maintain the amplitude relationship between the I and Q signals to ensure an accurate signal transmission. It is also important to maintain the phase relationship between the in-phase and quadrature-phase components of the local oscillator to prevent a phase skew. In reality, however, errors such as an IQ gain/phase imbalance existing in a zero-IF transmitter impairs the amplitude relationship and the phase relationship between the I and Q RF signals. The errors in the I and Q RF signals are also complicated by DC offset caused by the local oscillator signal leaking into transmission (i.e., LO leakage). The gain/phase imbalances between the I and Q arms may further ,depend on baseband frequency. The mismatch in I and Q arms leads to spectral images where signal spectrum on the right side of LO frequency causes unwanted images on the left side of LO frequency, and vice versa.

A correction is attempted to compensate for impairments caused by IQ mismatch and DC offset by feeding back the IQ RF signals through a feedback chain and correlating the IQ baseband signal with the observed feedback signal. Where signals of multiple tones are transmitted, however, the transmitted signals themselves interfere with an IQ mismatch or DC offset estimation, preventing an accurate IQ mismatch and DC offset estimation.

To suppress this interference sufficiently, an accurate transmit to feedback (TX-to-FB) channel response is required. Channel responses are also used to compensate signals for IQ mismatch and DC offset. Channel responses may be available only at a number of frequencies. For instance, the frequencies at which channel responses are available may depend on input signal scenario. In other words, only channel responses for frequencies at which input signals are present may be available.

To obtain an accurate channel response, a high-frequency resolution channel response estimator is required. For example, when a channel has an uncorrected delay of 2 samples at 491.52 MHz rate, then a 1024-pt frequency resolution channel response estimator is required to achieve a normalized error less of −40 dBc. Such high-frequency resolution channel response estimators are, however, prohibitive to implement, the least because of area constraints.

A frequency dependence of the channel response is largely due to delays. If such delays could be compensated, the frequency resolution of channel response estimator can be lowered and its size reduced, Hence an accurate estimation of transmit to feedback (Tx-to-FB) delay is critical.

SUMMARY

According to an aspect of the present invention, channel responses are measured whenever possible. Phase responses, each corresponding to a respective one of the measured channel responses, are extracted from the measure channel responses. At least one or more of the phase responses are grouped into an usable phase response group, based on then delay estimate uncertainty. Thereafter, all phase responses of the usable phase response group are subtracted with one of the phase value among all phase responses of the usable phase response group. The subtracted phase responses are wrapped to be within −180 to 180 degree range, where the phase responses of the usable phase response group are plotted on a graph with x-axis of frequencies and y-axis of degrees according to their respective phase degree and frequency. A delay is estimated based on the wrapped phase responses of the usable phase response group; in particular, the delay estimate is based on a slope and intercept estimate from the wrapped phase responses of the usable phase response group.

Thereafter, the delay estimate is further improved based on the phase responses that were not grouped into the usable phase response group. In one example, the phase responses that were not grouped into the usable phase response group are grouped separately into a remaining phase response group. The phases in the remaining phase response group are subtracted with the phase value that was used to subtract the phases of the usable phase response group. Afterwards, the subtracted phase responses of the remaining phase response group are unwrapped: 360 degree or a multiple of 360 degrees is added to or subtracted from the subtracted phase responses of the remaining phase response group. The delay estimate is updated based on the unwrapped phase responses of the remaining phase response group.

In yet another example, the phase responses that were not grouped into the usable phase response group may be added to the usable phase response group, based on the delay estimate from the slope and intercept estimate. Thereafter, a new delay estimate may be derived from the usable phase response group with the added phase responses.

BRIEF DESCRIPTION OF THE DRAWINGS

For a detailed description of various examples, reference will now be made to the accompanying drawings in which.

DETAILED DESCRIPTION

In the following detailed description, reference is made to certain examples of the present invention. These examples are described with sufficient detail to enable those skilled in the art to practice them. It is to be understood that other examples may be employed and that various structural, logical, and electrical changes may be made. Moreover, while specific examples are described in connection with a zero-IF transmitter, it should be understood that features described herein are generally applicable to other types of electronic parts, circuits, or transmitters, including low-IF transmitters.

In this description, the term "couple" or "couples" means either an indirect or direct wired or wireless connection. Thus, if a first device couples to a second device, that connection may be through a direct connection or through an indirect connection via other devices and connections. In another instance, when a first device is coupled to a second device, the first and second device may be coupled through a capacitor. The recitation "based on" means "based at least in part on." Therefore, if X is based on Y, X may be a function of Y and any number of other factors.

Figure 1:
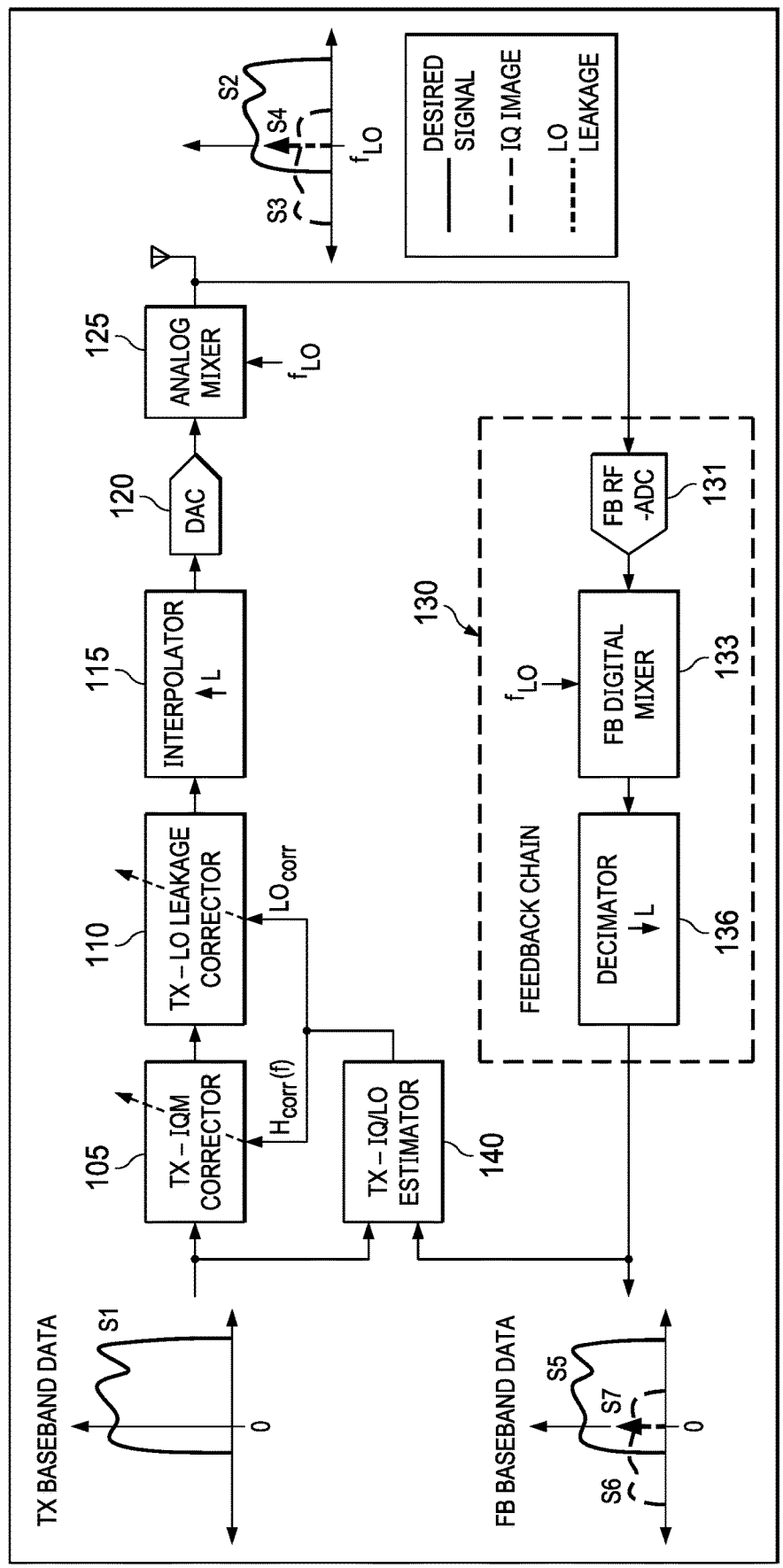
FIG. 1 illustrates a block diagram of a zero-IF transmitter.

FIG. 1 illustrates a block diagram of a zero-IF transmitter. The zero-IF transmitter example of FIG. 1 comprises Tx-IQM corrector 105 configured to adjust the baseband signal S1 to compensate for an IQ mismatch during transmission, Tx-LO corrector 110 configured to adjust the baseband signal S1 to compensate for LO leakage during transmission, interpolator 115, IQ digital analog converter 120, and analog mixer 125 configured to mix the baseband signal S1 with an in-phase and quadrature-phase component of a local oscillator signal of frequency L.

Signals S2, S3, and S4 are signals observed by a receiver after the zero-IF transmitter of FIG. 1 transmits IQ RF signals based on signal S1. Signal S2 is a signal that is desired to be transmitted by the zero-IF transmitter, signal S3 is an image signal of signal S2 due to IQ mismatch, and signal S4 is a DC offset due to LO leakage. Feedback chain 130 loops back the transmit signals through feedback RF digital analog converter 131, feedback digital mixer 133 that mixes the feedback signal with a local oscillator signal of frequency $f_o$, and decimator 136.

Signals S5, S6, and S7 are signals measured at an end of feedback chain 130 after the transmit signals S2, S3, and S4 are fed back. Signal S5 corresponds to signal S2, signal S6 to signal S3, and signal S7 to signal S4. Tx-IQ/LO estimator 140 estimates a channel response based on signals S1 and S5-S7, and further estimates IQ mismatch and LO leakage for a respective frequency. Based on the IQ mismatch estimates and LO leakage, Tx-IQ/LO estimator 140 provides an IQ mismatch correction function $H_{corr}(f)$ and LO leakage correction function $LO_{corr}$ to Tx-IQM corrector 105 and Tx-LO leakage corrector 110, respectively. Tx-IQM corrector 105 and Tx-LO leakage corrector 110 adjust signal S1 to compensate for IQ mismatch and LO leakage based on $H_{corr}(f)$ and $LO_{corr}$, respectively.

Figure 2A:
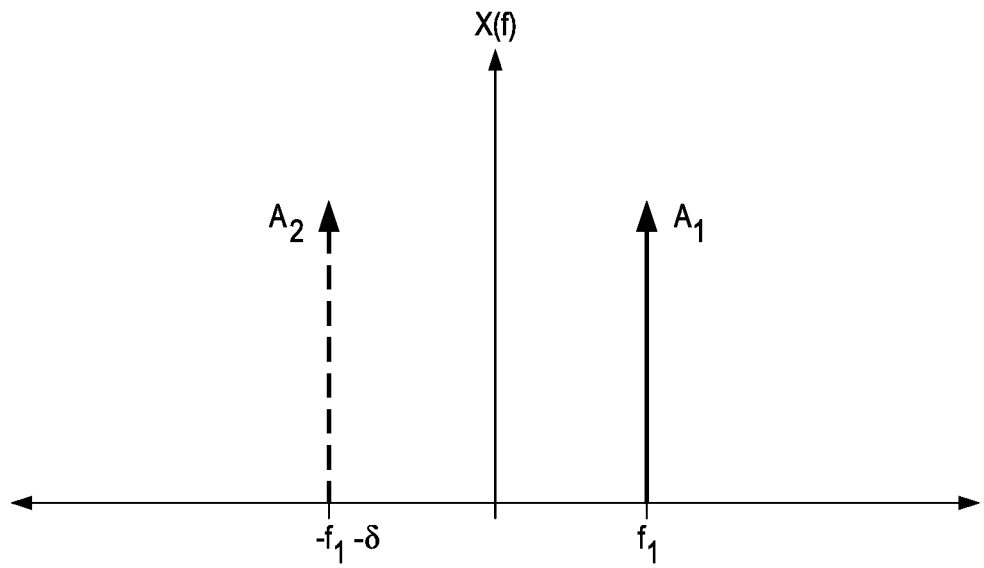
FIGS. 2A and 2B illustrate an exemplary frequency spectrum of a baseband signal transmitted via a direct up-conversion and a frequency spectrum of the feedback signals.
Figure 2B:
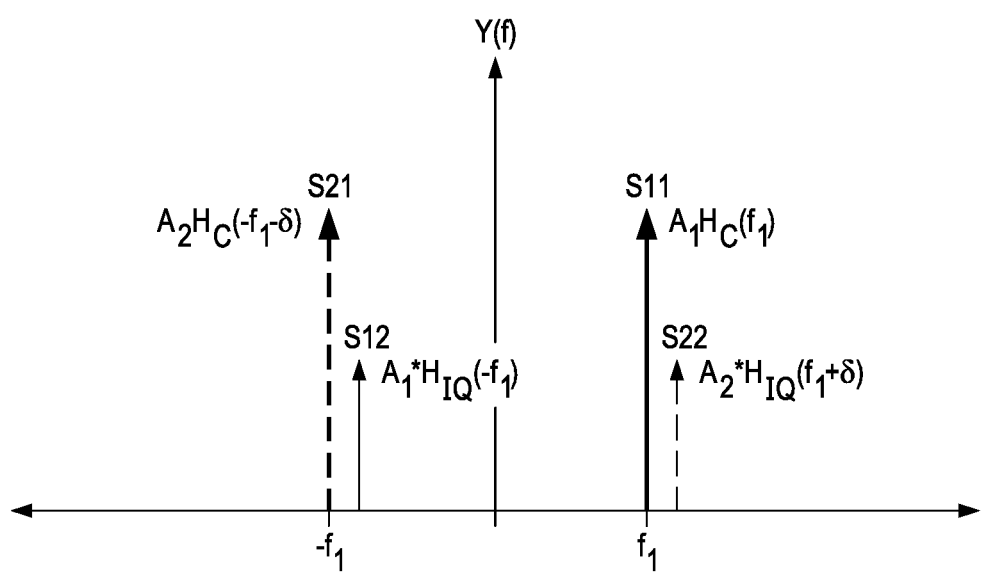

FIGS. 2A and 2B illustrate a frequency spectrum of a baseband signal transmitted via a direct up-conversion and a frequency spectrum of the feedback signals. In particular, the graph of FIG. 2A illustrates a sum of two continuous wave signals at frequencies $f_1$ and $f_1-\delta$. The two tone signals of frequencies $f_1$ and $-f_1-\delta$ are transmitted via a zero-IF transmitter. The graph of FIG. 2B illustrates the feedback signals based on the two tone signals of frequencies $f_1$ and $f_1-\delta$. In particular, signal S11, $A_1 H_c(f_1)$, and signal S12, $A_1^* H_{IQ}(-f_1)$, are based on a single tone signal of frequency $f_1$ with complex amplitude $A_1$. $H_c(f_1)$ indicates the channel response at $f_1$, and $H_{IQ}(-f1)$ indicates an IQ mismatch function in response to the transmitted signal of frequency $f_1$. Likewise, signal S21, $AH_c(-f_1-\delta)$, and signal S22, $A_2^* H_{IQ}(f_1+\delta)$, are based on a single tone signal of frequency $f_2=-f_1-\delta$ with complex amplitude $A_2$. $H_c(-f_1-\delta)$ indicates the channel response at $-f_1-\delta$, and $_{IQ}(f_1+\delta)$ indicates an IQ mismatch function in response to the transmitted signal of frequency $-f_1-\delta$.

In FIG. 2B graph, signal S21 is interfered by signal S12. Also, signal S11 is interfered by signal S22. Because of the interference, it is difficult to correctly estimate a channel response and IQ mismatch function at a frequency based on a transmission of a signal.

To suppress this interference sufficiently, an transmit-to-feedback (TX-to-FB) channel response with good accuracy, e.g., normalized error equal to or lesser than −40 dBc, for relevant frequencies are required. A high frequency resolution channel response estimator is utilized to determine the channel responses of relevant frequencies. For instance, when a channel has an uncorrected delay of 2 samples, at 491.52 MHz rate, a 1024-pt frequency resolution channel response estimator is required to achieve a normalized error equal to or lesser than −40 dBc. But high resolution channel response estimators may be prohibitive due to space and other constraints of electronic devices.

Channel responses are frequency dependent largely due to a signal delay. An aspect of the present invention, described below, provides exemplary methods and systems to accurately measure TX-to-FB signal delays, which is turn, may be used to reduce the channel response's frequency dependency and lower the high frequency resolution requirement of a channel response estimator to accurately measure a channel response.

To accurately measure TX-to-FB signal delays, an aspect of the present invention measures channel responses. Phase responses, each corresponding to a respective one of the measured channel responses, are extracted from the measure channel responses. At least one or more of the phase responses are grouped into an usable phase response group, based on then delay estimate and/or its uncertainty. Thereafter, all phase responses of the usable phase response group are subtracted with one of the phase value among all phase responses of the usable phase response group. The subtracted phase responses are wrapped to be within −180 to 180 degree range, where the phase responses of the usable phase response group are plotted on a graph with x-axis of frequencies and y-axis of degrees according to their respective phase degree and frequency. A delay is estimated based on the wrapped phase responses of the usable phase response group; in particular, the delay estimate is based on a slope and intercept estimate from the wrapped phase responses of the usable phase response group.

Thereafter, the delay estimate is further improved based on the phase responses that were not grouped into the usable phase response group. In one example, the phase responses that were not grouped into the usable phase response group are grouped separately into a remaining phase response group. The phases in the remaining phase response group are subtracted with the phase value that was used to subtract the phases of the usable phase response group. Afterwards, the subtracted phase responses of the remaining phase response group are unwrapped: 360 degree or a multiple of 360 degrees is added to or subtracted from the subtracted phase responses of the remaining phase response group. The delay estimate is updated based on the unwrapped phase responses of the remaining phase response group.

In yet another example, the phase responses that were not grouped into the usable phase response group may be added to the usable phase response group, based on the delay estimate from the slope and intercept estimate. Thereafter, a new delay estimate may be derived from the usable phase response group with the added phase responses. The details of these examples are further described below.

Figure 3:
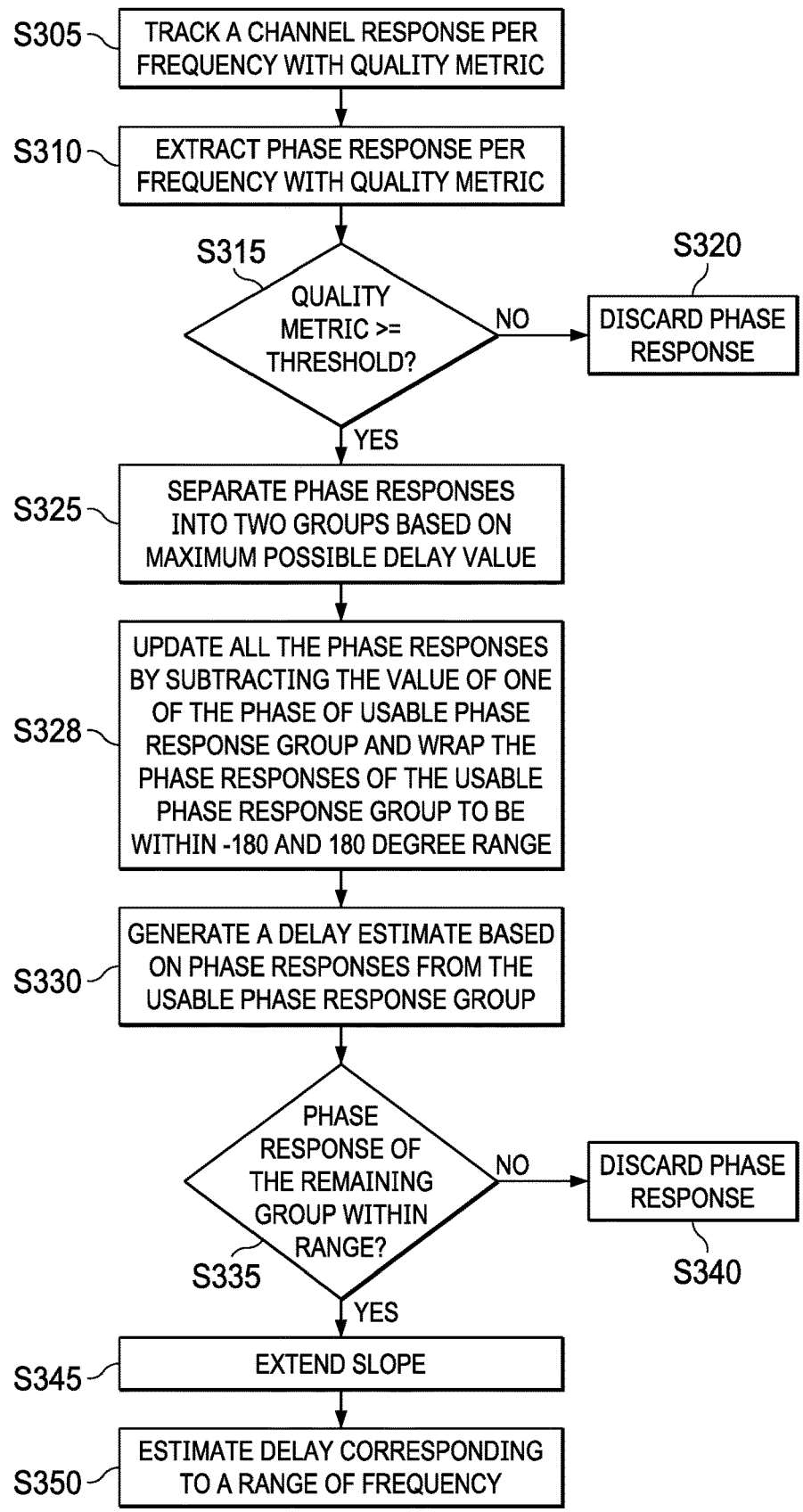
FIG. 3 illustrates a flowchart of signal delay estimating method according to an aspect of the present invention.

FIG. 3 illustrates a flowchart of a signal delay estimating method according to an aspect of the present invention. According to the example of FIG. 3, the method tracks a channel response per frequency. (S305). As noted above, not all channel responses for relevant frequencies may be tracked. In the example of FIG. 3, channel responses for frequencies where signals are present, or wherever possible, are tracked. A quality metric corresponding to each channel responses may also be compiled in step S305. The quality metric may be based on noise or signal level. For instance, where high degree of noise is observed, the quality metric will indicate that the corresponding channel response is of low quality. Also, if the signal levels observed in a transmitted or a feedback looped signal is low, the quality metric may indicate that the corresponding channel response is of low quality.

In step S310, a phase response per frequency is extracted from the tracked channel response per frequency. (S310). As noted above in step 305, channel response may also be tied to a quality metric. Phase response extracted from a channel response inherits the quality metric of the channel response. For instance, where a phase response is extracted from a channel response with low quality metric, the phase response is also marked with low quality metric.

In step 315, the method of FIG. 3 example checks whether a quality metric of a phase response if equal to or above a threshold. (S315). If the method determines that the quality metric is below the threshold, the phase response is discarded in step 320. (S320). According to another example, a phase response with a below threshold quality metric may be separated into the remaining phase response group in the below step 325.

According to an aspect of the present invention, extracted phase responses are separated into at least two groups. In the example of FIG. 3, the responses are separated into two groups, an usable phase response group and a remaining phase response group. (S325). If no quality metric is measured with a channel response, all phase responses extracted from the tracked channel responses will be separated into two groups. If quality metric is measured and analyzed, only phase responses with a quality metric equal to or above a threshold will be separated into the two groups: the phase responses with lower than the threshold quality metric will be discarded. According to another example, a phase response with a below threshold quality metric may be placed into the remaining phase response group. According to yet another example, phase responses with very low quality metric based on yet another threshold may be discarded.

Initially, a TX-to-FB delay to be estimated according to an aspect of the present invention is assumed to be between $d_{nom}-d_{max}$ and $d_{nom}30\ d_{max}$ where $d_{nom}$ is a nominal delay value and $d_{max}$ is a maximum possible delay error with respect to the nominal delay value. These values may be based on a setting of a zero-IF transmitter, previous delay estimates of the zero-IF transmitter, results of a delay situation of the zero-IF transmitter, etc. In one example, the two values may be provided as inputs. In another example, the maximum possible delay error ($d_{max}$) may be calculated from the nominal delay value ($d_{nom}$).

In step 325, maximum possible delay error ($d_{max}$) is either calculated or provided as an external input. And based on the maximum possible delay error (or delay offset), maximum frequency spacing ($\Delta f_{MAX}$) for which maximum absolute phase change is less than a configurable threshold, e.g., 180 degrees or smaller, is calculated. According to an aspect of the present invention, the mathematical relationship between the maximum frequency spacing $\Delta f_{MAX}$ and maximum possible delay error $d_{max}$ may be expressed as below equation 1.

$$\Delta f_{MAX} = \frac{180 - \text{margin}}{360 * d_{max}}, \quad \text{[Equation 1]}$$

where margin is a preset phase margin in degrees.

In the above equation 1, if $d_{max}$ is in seconds, the $\Delta f_{MAX}$ will be in Hz. Margin may account for the quality of phases responses, modelling errors, etc.

Among the all extracted phase responses, a subset of phase responses, within which the farthest frequency spacing of any two phase responses is closest to but not larger than the maximum frequency spacing $\Delta f_{MAX}$, is separated into the usable phase response group. The remaining phase responses are separated into the remaining phase response group.

Figure 4A:
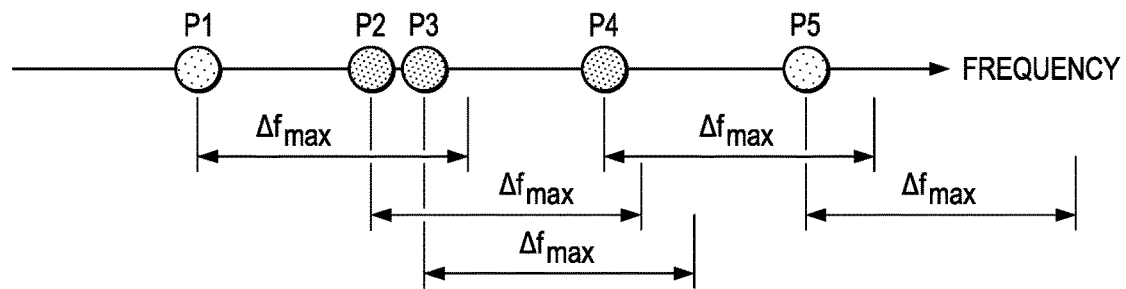
FIG. 4A and 4B illustrate the extracted phase responses in relation to their frequencies, and a subset thereof.
Figure 4B:
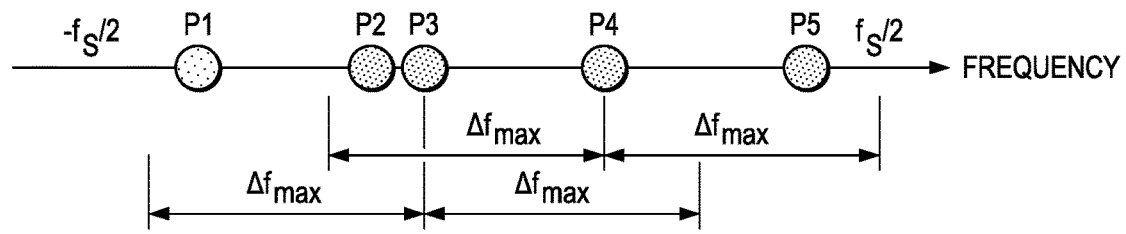

FIGS. 4A and 4B illustrate an example of selecting a subset of phase responses from the extracted phase responses, which are reflected on the frequency axis in relation to their frequencies, as the phase responses of the usable response group. In FIG. 4A, five phase responses P1-P5 with equal to or above the threshold quality metric are separated into the usable phase response group and the remaining phase response group. In the example of FIG. 4A, phase responses P2, P3, and P4 are determined as a subset of phase responses, of which the farthest frequency spacing between any two phase responses of the subset is closest to but not larger than $\Delta f_{MAX}$. Accordingly, in step, 325, phase responses P2, P3, and P4 are separated into the usable phase response group and phase responses P1 and P5 are separated into the remaining phase response group.

In step 328, the phase responses categorized into the two groups in the above step 325 are updated. This step is an optional step that depends on the values of the phase responses. For example, in step 328, all phase responses of FIG. 4A are updated by subtracting the values of the phases responses with the value of one of the phase responses, P2, from the usable group. (S328). In another example, either the value of phase response P3 or phase response P4 may be subtracted from all phase responses of FIG. 4A. After the subtraction, the phase responses of the usable group are wrapped to be within −180 to 180 degree range where the phase responses of the usable group are plotted on a graph with x-axis of frequencies and y-axis of degrees according to their respective phase degree and frequency. See for example, the phase response graphs in FIG. 5. A delay error may be easily estimated by a slope based on the phase responses of the usable group as explained below in step 330.

In another embodiment, the usable phase response group can be identified as a subset of phase responses of which the respective frequency spacing are within maximum frequency spacing $\Delta f_{MAX}$ from a pivot phase response within the group. For example, in FIG. 4B, any of the phase responses P1-P5 may be a pivot phase response. Selecting phase response P4 as a pivot response, however, allows phase responses P2 and P3 on the left to phase response P4 and phase response P5 on the right to be within the maximum frequency spacing $\Delta f_{MAX}$ from the pivot response. In the example of FIG. 4B, the use of maximum frequency spacing $\Delta f_{MAX}$ in selecting the subset is maximized as the subset includes phase response from left and right of the pivot response. After the subset is selected, the value of the pivot phase response (or either the value of phase responses P3, phase response P4, or phase response P5 of FIG. 4B) is subtracted from all phase responses of both the usable phase response group and remaining phase response group in step 328. Further, the subtracted phase responses of the usable phase response group of FIG. 4B are wrapped to be within −180 to 180 degree range in step 328.

In step 330, a delay estimate based on the updated phase responses from the usable phase response group is generated. (S330). For instance, in the example of FIG. 4A, the delay estimate will be generated to reflect the phase responses P2, P3, and P4. In the example of FIG. 4B, the delay estimate will be generated to reflect phase responses P2, P3, P4, and P5.

In step 330, a number of methods may be employed to generate the delay estimates based on phase responses P2, P3, and P4 of FIG. 4A and phase responses P2, P3, P4, and P5 of FIG. 4B. According to an aspect of the present invention, the delay estimate is be obtained by estimating a slope and intercepting a straight line that best fits the three phase responses. In this case, the delay estimates are proportional to the estimated slope. The straight line that best fits the three phase responses is a straight line with the least sum of error square value in relation to the three phases responses. According to yet another aspect of the present invention, the two farthest phases responses within the subset (for example, in FIG. 4A, phases responses P2 and P4) may be utilized. In other words, slope is estimated based on intercepting a straight line that best fits the two phases responses P2 and P4 of FIG. 4A.

Quality metric for both the delay and intercept estimates may also be computed. According to an aspect of the present invention, the quality metric of the delay and intercept estimate is computed based on the quality metrics of the individual phase responses (e.g., phases responses P2, P3, P4 of FIG. 4A).

According to yet another aspect of the present invention a "Recursive Slope-Intercept Extractor," which fits a slope-intercept model on a series of phase measurements, may be employed to output a joint slope-intercept quality metric (a 2-D matrix-P). The diagonal elements of P contain the quality metrics (e.g., variance) of the slope and intercept estimates respectively, whereas the off-diagonal element contains the co-variance between the slope and the intercept estimates.

In step 335, whether a phase response from the remaining phase response group can be used is determined. (S335). As noted above, the phase responses of the remaining phase response group may be subtracted with a phase value of the usable phase response group in step 328.

The phase responses extracted from the tracked channel responses reset or roll over every 360 degrees. Accordingly, 360*n degrees, wherein n is an integer, is added to or subtracted from the phase values of the phase responses in the remaining phase response. Afterwards, it is determined whether the 360*n degrees added or subtracted phase is within a phase estimate projection range of a respective frequency in step 335. The projection range is obtained by using at least one of the slope estimates (which are delay estimates), intercept estimates or their joint quality metrics.

Figure 5A:
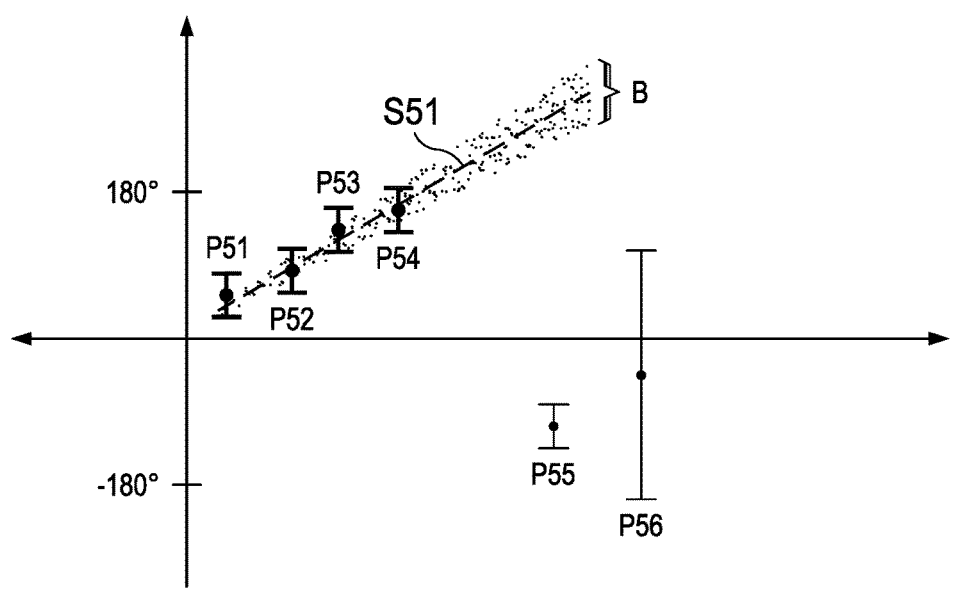
FIG. 5A, 5B, and 5C illustrate graphs demonstrating a delay estimate generated according to an aspect of the present invention.
Figure 5B:
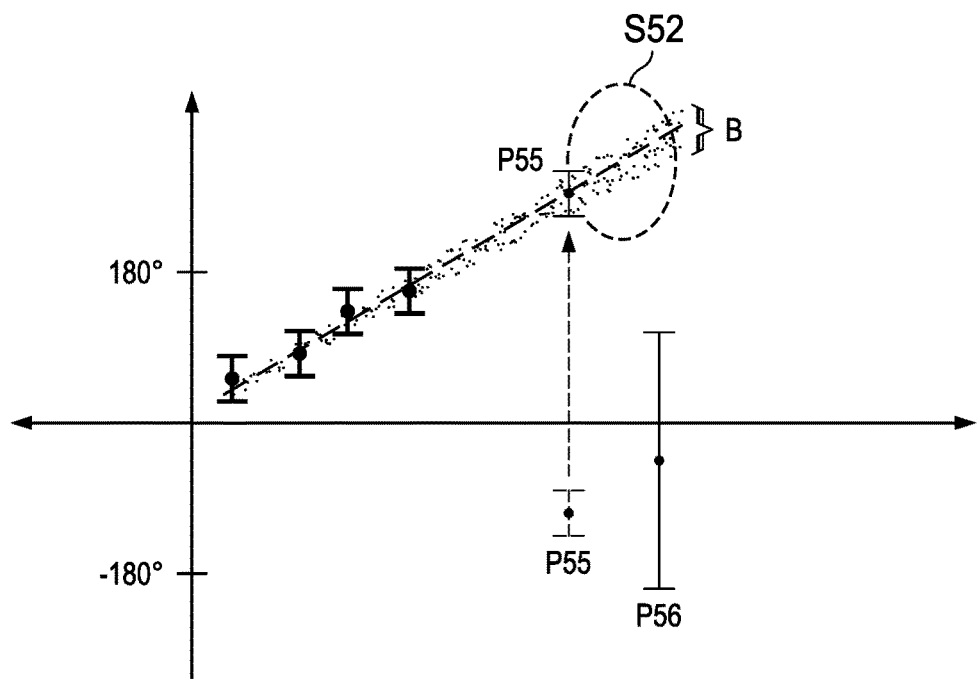
Figure 5C:
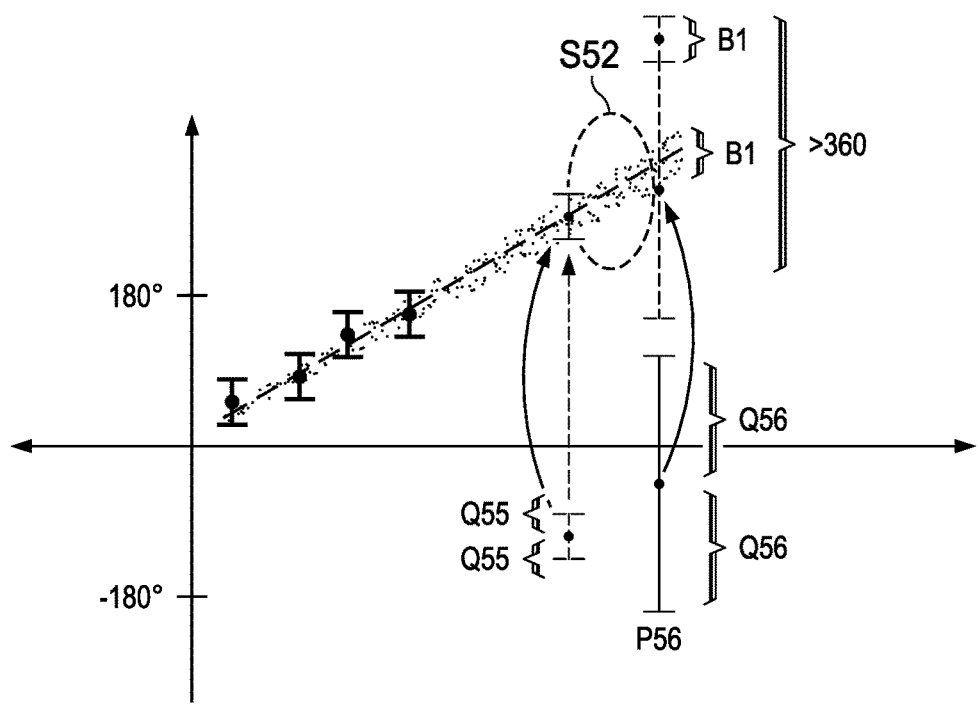

For instance, FIGS. 5A-5C illustrate graphs with a delay estimate generated according to an aspect of the present invention. In graph of FIG. 5A, four phase responses, P51-54, of a usable phase response group are marked on a graph with x-axis of frequency and y-axis of phase. A delay and intercept estimates S51 are generated based on four phase responses P51-P54. Using the delay and intercept estimates S51, phase responses at all other frequencies, besides the frequencies of phase responses P51~P54 are extrapolated.

A preset range of band of uncertainty (B) of the extrapolated phase values is also illustrated in graph (a). The band (B) may be calculated based on the joint quality metric of delay and intercept estimates, which in turn depends on a quality metric of the phase responses from which delay estimate S51 and intercept estimate are generated: phase responses P51-54 of FIG. 5A.

In graph of FIG. 5B, a phase response from the remaining phase response group may be used to improve the accuracy of the delay estimate S51 and intercept estimate. In graph (b), phase responses P55 and P56 are from the remaining phase response group. Pursuant to step S335, a multiple of 360 degrees is added to the phase value of phase response P55 to determine whether phase response P55 may be used to improve the delay and intercept estimates S51. As seen in graph of FIG. 5B, the added phase value of phase response P55 is within the a portion (S52) of the projected band, which correspond to the frequencies of phase responses P55, P56 of the remaining phase response group, and within the band of uncertainty (B). In such case, phase response P55 has been successfully unwrapped to be used to further improve the delay estimate accuracy.

A multiple of 360 degrees is also added to the phase value of phase response P56. As seen from graph of FIG. 5C, however, the added phase value of P56 is not within the band of uncertainty (B) of the portion (S52) of projected band.

Furthermore, according to yet another aspect of the present invention, the upward and downward wings (Q56) of phase response P56 indicate the poor quality metric of phase response P56. When the degree corresponding to the stretch of the upward and downward wings (Q56), combined with the degree corresponding to the thickness (B1) of the band (B), is more than 360 degrees, the respective phase response, P56, cannot be unwrapped. In other words, the projected phase error from the slope and intercept estimates' joint quality metric at the frequency corresponding to phase response P56, which is expressed as uncertainty (B), is added to the computed phase error based on the quality metric (Q56) of phase response at P56. This should be less than a configurable threshold, such as 360 degrees. If not, in step 340, such phase response is discarded. (S340).

In the graphs of FIGS. 5A-5C, the upward and downward wings of a phase response reflects the quality metric of the respective phase response. A phase response with a lower or poorer quality metric has a longer upward and downward wings. In graph of FIG. 5C, the upward and downward wings (Q55) of phase response P55 is shorter than the upward and downward wings (Q56) of phase response P56. This indicates that phase response P55 has a higher quality metric and is more accurate than phase response P56.

Based on the delay estimate generated according to steps S305-S345, the example method of FIG. 3 can estimate a round trip delay dent corresponding to a frequency of interest in step 350. (S350). An accurate round trip delay is used to accurately align the TX and Fb data with the next iteration of estimation of IQ mismatch and LO leakage. This reduces the frequency dependence of a channel response and leads to a more accurate channel response in a given frequency bin.

Other examples of delay estimations based on an aspect of the present invention, e.g., estimating delays based on channel responses at frequencies where signals are present (i.e., available channel responses) and phase responses extracted from the available channel responses, are possible. For example, the available frequency responses may be split into multiple usable phase response groups. A delay estimate may be obtained from each of the usable phase response groups and a final delay estimate may be obtained from a weighted averaging of these delay estimates based on their quality.

In the above example, the available frequency responses included in the usable phase response groups can be either completely exclusive or overlap with each other. For example, if there are five phase responses P1, P2, P3, P4 and P5 as shown in FIGS. 4A, 4B, then the five phase phases responses may form two usable phase response groups: usable group 1 comprising of phase responses P1, P2, P3, and usable group 2 comprising phase responses P4, P5. Delay and intercept estimates are obtained from each of the response groups: the usable group 1 and the usable group 2. A final delay estimate may be obtained based on the weighted average of the delay estimates of the usable group 1 and the usable group 2. The weighting may be based on the quality metric of the delay estimates from each of the usable phase response groups, in the above example, usable group 1 and usable group 2.

In another example the phase response may form three usable phase response groups: usable group 11 with phase responses P1, P2, P3, usable group 12 with phase responses P2, P3, P4, and usable group 13 with phases responses P4, P5. Three delay estimates, each corresponding to the usable groups 11, 12, and 13 may be obtained and averaged with their respective weights to generate a final delay estimate. In this example, phases P2, P3, P4 are present in two different response groups.

Figure 6:
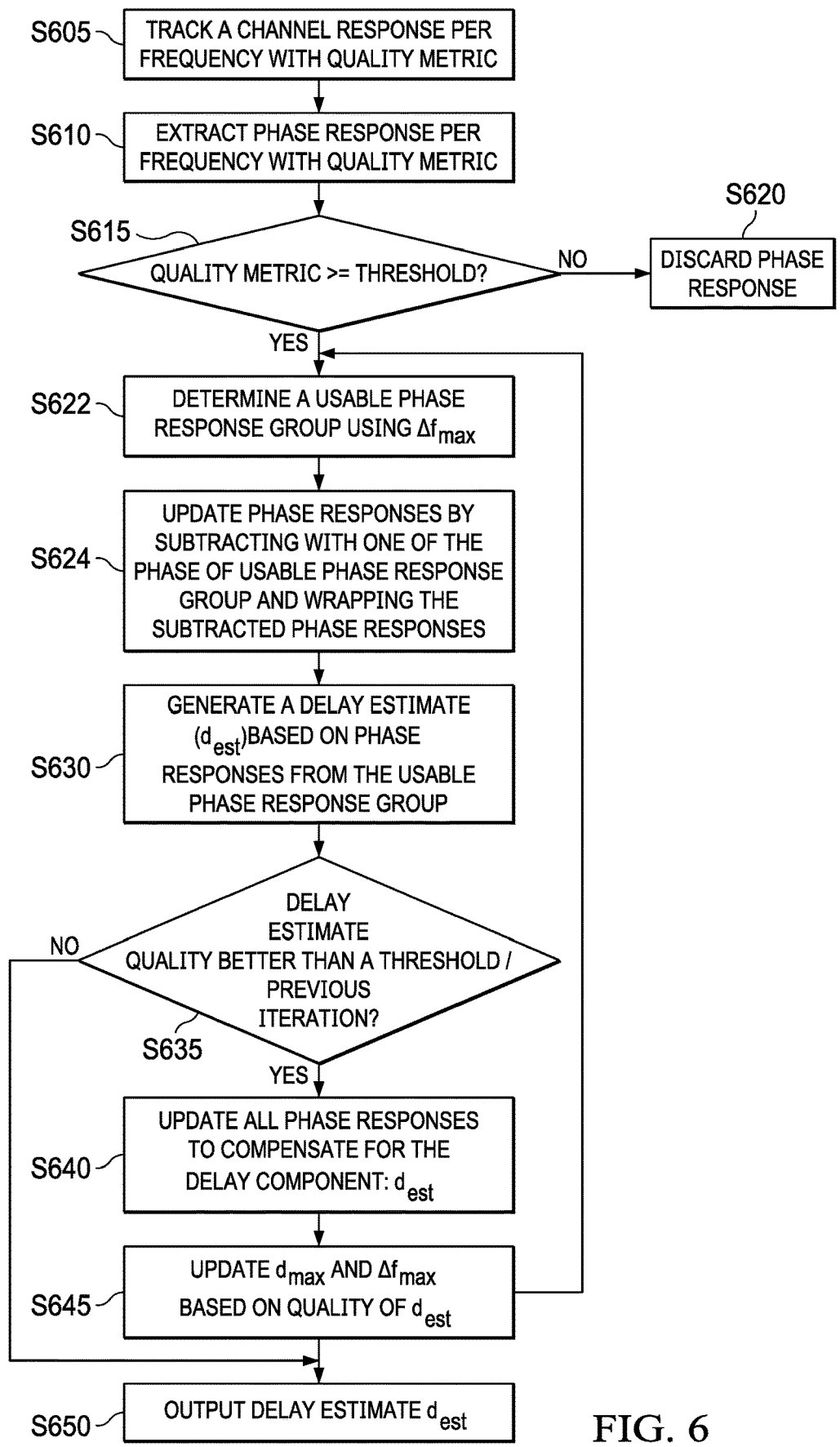
FIG. 6 illustrates a flowchart of signal delay estimating method according to yet another aspect of the present invention.

According to yet another aspect of the present invention, a usable phase response group is iteratively re-computed by progressively reducing the maximum possible delay error $d_{max}$ value. FIG. 6 illustrates an example of a flowchart according to the aspect of the present invention where usable phase response group is iteratively re-computed.

In FIG. 6, steps 605, 610, 615, and 620, respectively comparable to steps 305, 310, 315, and 320 of FIG. 3, are performed to extract phase responses from available channel responses and discard phase responses below a threshold. (S605, S610, S615, S620). In step 622, a number of non-discarded/remaining phase responses are selected to form a usable group based on maximum frequency spacing $\Delta f_{max}$. (S622).

Figure 7A:
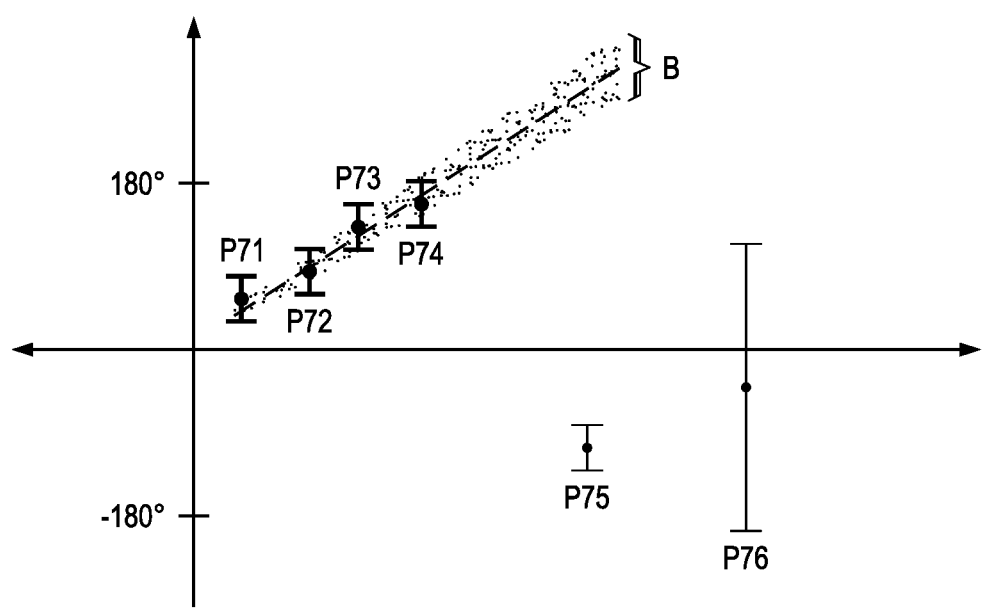
FIGS. 7A, 7B, and 7C illustrate graphs demonstrating a delay estimate generated according to yet another aspect of the present invention.

Initially, an initial usable phase response group is formed based on the initial maximum possible delay error $d_{max}$. In particular, an initial maximum frequency spacing $\Delta f_{max}$ based on the initial maximum possible delay error $d_{max}$, is calculated according to Equation 1. Among the non-discarded phase responses, a subset of the non-discarded phase responses, within which the farthest frequency spacing of any two phase responses is closest to but not larger than the maximum frequency spacing, is selected as the initial usable group. Graph of FIG. 7A illustrates phase responses P71~P74, among phase responses P71~P76, forming an initial usable phase response group according to step 622.

In step 624, phase responses of the initial usable phase response group are updated by subtracting the phase response with one of the phase of the usable group selected in step 622, similar to step 328 of FIG. 3. (S624). Step 624 is an optional step, similar to step 328. Further similar to step 328 of FIG. 3, in step 624, the subtracted phase responses of the initial usable phase response group are wrapped to be within −180 to 180 degree range. The wrapping of the phase responses in step 624 is an optional step, which is performed where the phase responses of the usable phase group is not within −180 to 180 degree range. In step 630, an initial delay estimate, $d_{est}$, is computed. (S630). The initial delay estimate, $d_{est}$, is computed by estimating a slope and intercepting a straight line that best fits the phases responses of the initial usable group. In another example, slope is estimated based on a straight line that best fits the two farthest phase responses within the initial usable group.

In step 640, phase responses are updated to compensate the phase responses for delay, based on the following equation 2. (S640).

$$\theta(f) = \theta(f) - 360 * f * d_{est}, \text{ where } \theta(f) \text{ is the phase response in degrees.} \quad \text{[Equation 2]}$$

Figure 7B:
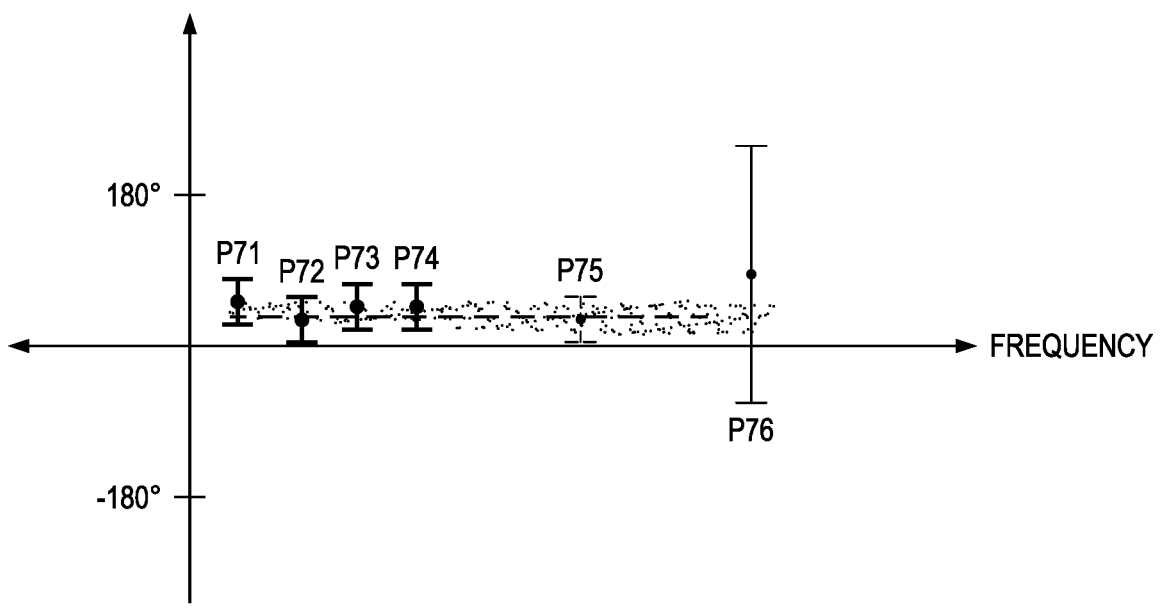

Graph of FIG. 7B illustrates phase responses P71~P76 compensated according to Equation 2. Optionally, in step 640, the phase responses that do not belong to the initial usable phase response group may be wrapped before being compensated according to Equation 2. In other words, multiple of 360 degrees are added to or subtracted from phase responses that do not belong to the previous usable phase response group. In the example of FIG. 7B, phase responses P75 and P76 are wrapped before they are compensated according to Equation 2.

In step 645, a subsequent maximum possible delay error $d_{max}$ is obtained based on the quality (e.g., preset range of band of uncertainty (B) of FIG. 5) of the current delay estimate $d_{est}$. (S645. Further, pursuant to Equation 1, a subsequent maximum frequency spacing $\Delta f_{MAX}$ is computed using the updated, subsequent, maximum possible delay error $d_{max}$. With the subsequent $\Delta f_{MAX}$, a new usable group is determined and a subsequent delay estimate, $d_{est}$, is computed by repeating the steps 622, 624, and 630. For example, in graph FIG. 7B, phase response P75 is added to a usable group after the subsequent maximum frequency spacing $\Delta f_{MAX}$ has been computed. See graph of FIG. 7C. Accordingly, the subsequent delay estimate, $d_{est}$, based on the subsequent usable group with newly added phase response P75, is generated in the second iteration of step S630.

In step 635, the quality of the current delay estimate (e.g., subsequent delay estimate of the above paragraph) is compared with the quality of the previous delay estimate (e.g., initial delay estimate). Where the quality of the current delay estimate is better than the previous quality, steps 640, 645, and steps 622, 624, 630, 635, are repeated. For instance, in the graph of FIG. 7C, phase response P75 has been added to the usable group and quality of the subsequent delay estimate based on the new usable group with phase response P75 has been improved. The improvement of the quality is reflected in FIG. 7C as the width of the band (B) is narrower than the width of the band (B) of FIG. 7A. In such case, all phase responses are updated based on the subsequent delay estimate in step S640 and maximum possible delay error $d_{max}$, and maximum frequency spacing $\Delta f_{MAX}$ is updated in step 645, followed by steps 622, 624, 630, and 635.

Where the quality of the current delay estimate is not better than the previous quality, in step 650, the latest delay estimate is selected as a delay to use. (S650). In other words, the process proceeds iteratively until between successive iterations there is no improvement in the delay estimate quality. In one example, when no new phase response is added to the usable group, the quality of the delay estimate also stops improving.

Figure 7C:
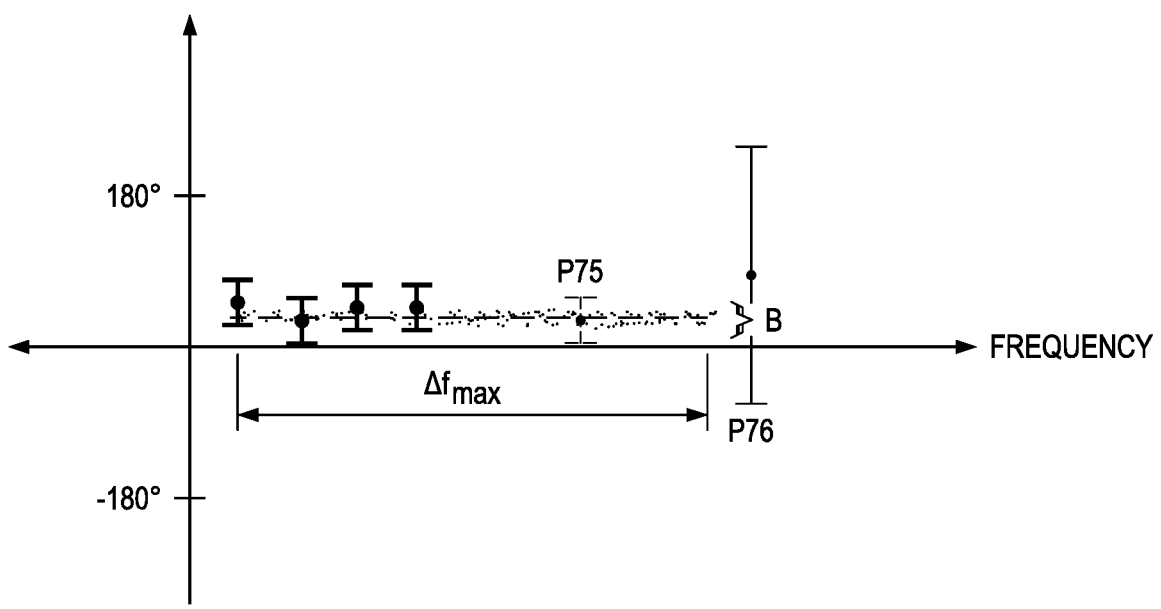

Pursuant to the example of FIGS. 6 and 7, where a nominal delay value $d_{nom}$ is 200 samples and a maximum possible delay error $d_{max}$ is 2 samples, the range of delay estimate $d_{est}$ is within (200−2 )~(200+2) samples. Under this environment, an initial phase responses shall have a residual delay anywhere between −2 and 2 samples. Assume after the first iteration of steps S622 and S624, an initial delay estimate $d_{est}$ is 0.9 samples with a quality metric of 0.2 samples. That means the residual delay is in between (0.9− 0.2 )~(0.9+0.2). The phases (e.g., phase responses P71~P76 of FIGS. 7A-7C) are rotated by 0.9 sample according to equation 2 in the first iteration of step S640 and maximum possible delay error $d_{max}$ is now updated to 0.2 from the initial value of 2 in step S645. Maximum frequency spacing $\Delta f_{MAX}$ is also updated according to equation 1 in step S645, leading to a larger value.

A larger $\Delta f_{MAX}$ in the next iteration of steps S622 and S624 can lead to include of more phase responses, upon which a more accurate slope can be estimated and lead to an improved delay estimate accuracy. Once the delay accuracy is computed according to the second iteration of step S630, qualities of the current and previous delay estimates are compared to determine whether there is a need for a subsequent iteration. If the quality metric of the current delay estimate has not improved, the iteration of the process stops and current delay estimate is output in step S650.

Figure 8:
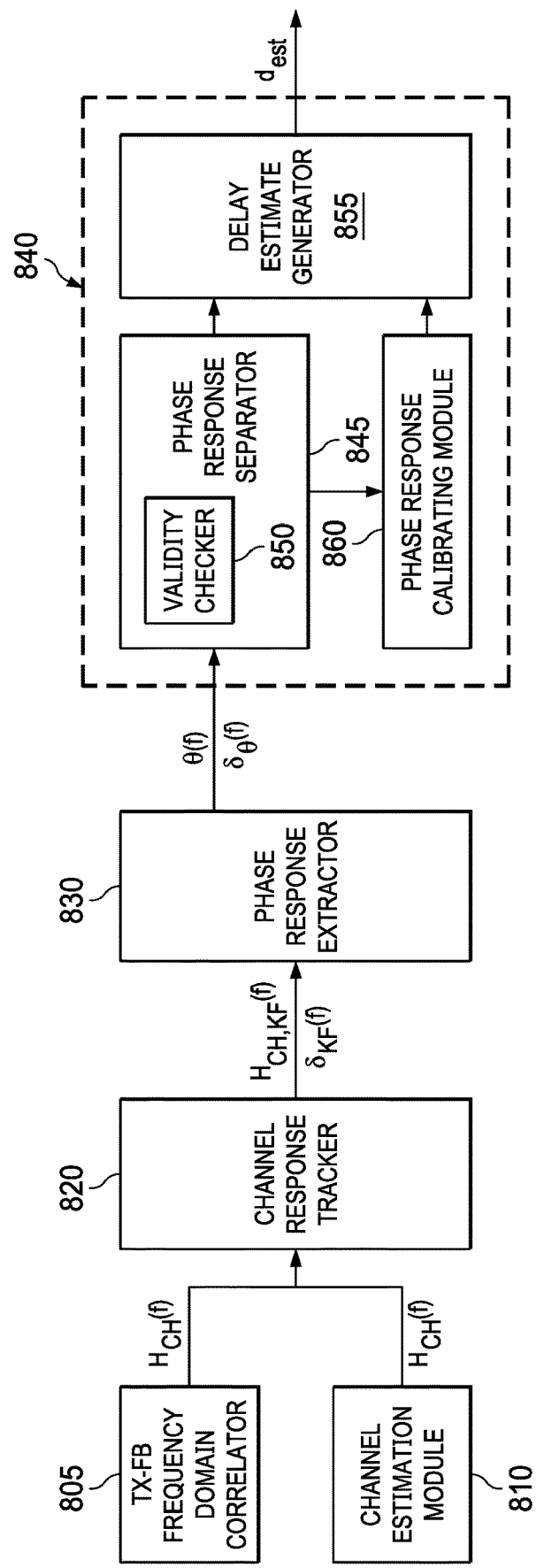
FIG. 8 illustrates a block diagram of a delay estimating module according to an aspect of the present invention.

FIG. 8 illustrates a block diagram of a delay estimating module according to an aspect of the present invention. The delay estimating module of FIG. 8 comprises Tx-feedback frequency domain correlator 805 configured to generate a channel response for a given frequency and a channel estimation module 810 configured to generate a channel response based on a pair of calibrating signals based on an IQ baseband signal. Channel response tracker 820 is configured to track the channel responses $H_{CH}(f)$ received from Tx-feedback frequency domain correlator 805 and channel estimation module 810. Channel response tracker 820 may also compile a quality metric for each channel response based on at least one of: noise or signal level.

Channel estimation module 810 may be based on an example of the invention, including a channel estimation module, disclosed in the Indian provisional application no. 201841044799, which was filed Nov. 28, 2018, and U.S. provisional application No. 62/786,496, which was filed Dec. 30, 2019 and claiming priority to the Indian provisional application no. 201841044799, both of which are incorporated herein by reference.

Phase response extractor 830 is configured to extract phase response $\Theta(f)$ from the tracked channel response $H_{CH,KF}(f)$. The quality metric of a given tracked channel response $H_{CH,KF}(f)$, which is expressed as $\delta_{KF}(f)$, is reflected in the quality metric $\delta_\Theta(f)$ provided by phase response extractor 830 per phase response $\Theta(f)$.

The components within block 840 of FIG. 8 are configured to estimate a delay ($d_{est}$) based on a phase response $\Theta(f)$ and its respective quality metric $\delta_\Theta(f)$. In particular, phase response separator 845 separates phase responses extracted from phase response extractor 830 into at least two groups. In the example of FIG. 8, phase response separator 845 may separate phase responses into a usable phase response group and remaining phase response group according to the method and various alternatives disclosed in relation to FIG. 3. Alternatively, phase response separator 845 may group a number of phase responses into an initial phase response group as disclosed in relation to FIG. 6. Phase response separator 845 may also subtract from the phase responses of either the usable phase response group or the remaining phase response group, with a value of a phase response of the usable phase response group.

Phase response separator 845 may comprise validity checker 850 to check whether a quality metric of a phase response is equal to or above a threshold. Validity checker 850 may discard a phase response with a quality metric below the threshold. In another embodiment, validity checker 850 may pass a phase response with a quality metric below the threshold but above a second lower threshold to phase response separator 845 to be separated into the remaining phase response group.

Delay estimate generator 855 is configured to generate a slope based on phase response from the usable phase response group, pursuant to the steps of FIG. 3. Phase response calibrating module 860 is configured to wrap the phase responses of the usable phase response group before delay estimate generator 855 generates a slope based on the usable phase response group, pursuant to the steps of FIG. 3. Phase response calibrating module 860 is further configured to unwrap the phase responses of the remaining phase response group. When the phase responses of the remaining phase response group are successfully unwrapped, delay estimate generator 855 extends the delay estimate to cover the unwrapped phase responses and outputs as delay estimates (dent).

Alternatively, delay estimate generator 855 is configured to generate a slope based on a phase response for an initial and successive usable phase response group, pursuant to the steps of FIG. 6. Phase response calibrating module 860 is configured to wrap the phase responses of the initial and successive usable phase response group before delay estimate generator 855 generates a slope based on the initial and successive phase response group, pursuant to the steps of FIG. 6.

The above description and drawings are only to be considered illustrative of an example of the present invention which achieves the features and advantages described herein. Modifications are possible in the described examples, and other examples are possible, within the scope of the claims. Accordingly, the examples of the present invention described herein is not considered as being limited by the foregoing description and drawings.

What is claimed is:

1. A signal delay estimating method comprising:
 tracking a channel response for each frequency of a plurality of frequencies;
 extracting a phase response for each frequency of the plurality of frequencies from the tracked channel responses;
 separating the extracted phase responses into at least two groups based on a maximum delay error, wherein the at least two groups comprise a usable phase response group and a remaining phase response group;
 generating a delay estimate based on a phase response of the usable phase response group, and
 updating the delay estimate based on a phase response of the remaining phase response group.

2. The signal delay estimating method of claim 1,
 wherein the separating of the extracted phase responses comprises determining a maximum frequency spacing based on the maximum delay error;

a frequency spacing between any two phase responses of the usable phase response group, or between any phase response of the usable phase response group and a pivot phase response, is less than the maximum frequency spacing; and the usable phase response group comprises phase responses to maximize the largest of the frequency spacing between any two phase of the usable phase response group.

3. The signal delay estimating method of claim 2, wherein the pivot phase response comprises a phase response of the phase responses of the usable phase response group.

4. The signal delay estimating method of claim 2, wherein the maximum frequency spacing is determined based on an equation below:

$$\Delta f_{MAX} = \frac{180 - \text{margin}}{360 * d_{max}},$$

where margin is a preset phase margin in degrees, $d_{max}$ is the maximum delay error in seconds, $\Delta f_{MAX}$ is the maximum frequency spacing in Hz.

5. The signal delay estimating method of claim 1, wherein the method further comprising, subtracting all phase responses of the usable phase response group with a value of a phase response of the usable phase response group, and wherein the delay estimate is based on the subtracted phase responses of the usable phase response group.

6. The signal delay estimating method of claim 1, wherein the method further comprising, wrapping each phase response of the usable phase response group to be within −180 and 180 degree range by adding to a value of the each phase response of the usable phase response group 360*n degrees, wherein n is an integer, and wherein the delay estimate is based on the wrapped phase responses of the usable phase response group.

7. The signal delay estimating method of claim 1, wherein the phase response of the usable phase response group includes at least two phase responses, each phase response of which corresponding to a different frequency, and wherein the delay estimate is based on a slope and intercept estimate of the at least two phase responses of the usable phase response group plotted on a graph of x-axis of frequencies and y-axis of degrees.

8. The signal delay estimating method of claim 7, wherein the method further comprises, unwrapping each phase response of the remaining phase response group by adding to a value of the each phase response of the remaining phase response group 360*n degrees, wherein n is an integer;

determining whether the unwrapped phase response is within a preset range of the delay estimate; and updating the delay estimate based on the unwrapped phase response that is within the preset range.

9. The signal delay estimating method of claim 8, wherein the preset range is based on the delay estimate, the intercept estimate, a quality metric of the delay estimate, a quality metric of the intercept estimate, or a quality metric of the at least two phase responses.

10. The signal delay estimating method of claim 8, wherein the updating of the delay estimate further comprises updating the intercept estimate, a quality metric of the updated delay estimate, or a quality metric of the updated intercept estimate based on the unwrapped phase response that is within the preset range.

11. The signal delay estimating method of claim 8, wherein the method further comprising, subtracting all phase responses of the remaining phase response group with a value of a phase response of the usable phase response group.

12. The signal delay estimating method of claim 8, wherein the updating of the delay estimate comprises generating a delay estimate based on the at least two phase responses of the usable response group and the unwrapped phase response of the remaining phase response group that is within the preset range of the delay estimate.

13. The signal delay estimating method of claim 1 wherein the usable phase response group comprises a first usable phase response group and a second usable phase response group, and the delay estimate generated comprises a first delay estimate based on a phase response from the first usable phase response group and a second delay estimate based on a phase response from the second usable phase response group; and wherein the signal delay estimating method further comprises generating a final delay estimate based on a weighted average of the first delay estimate and the second delay estimate.

14. The signal delay estimating method of claim 1, wherein the channel response tracking comprises compiling a quality metric of each of the tracked channel responses based on at least one of: noise, and signal level, and the extracted phase response comprises a phase response corresponding to a tracked channel response of which its quality metric is equal to or above a threshold value.

15. A signal delay estimating method comprising, tracking a channel response for each frequency of a plurality of frequencies;

extracting a phase response for each frequency of the plurality of frequencies from the tracked channel responses;

generating an initial usable phase response group, wherein the initial usable phase response group includes at least two of the extracted phase responses based on an initial maximum delay error;

generating an initial delay estimate based on the initial usable phase response group;

updating the extracted phase responses based on the initial delay estimate;

generating an updated maximum delay error by updating the initial maximum delay error based on the initial delay estimate;

generating an updated usable phase response group, wherein the updated usable phase response group includes at least one of the updated extracted phase responses and wherein the at least one of the updated extracted phase responses was not included in the initial usable phase response group;

generating an updated delay estimate based on the updated usable phase response group;

comparing a quality metric of the updated delay estimate to a quality metric of the initial delay estimate; and repeating the updating of the extracted phase responses, maximum delay error, usable phase response group and delay estimate where the quality metric of the updated delay estimate is more improved than the quality metric of a previous delay estimate.

16. The signal delay estimating method of claim 15, wherein the generating of the initial usable phase response group comprises,
generating an initial maximum frequency spacing based on an equation below:

$$\Delta f_{MAX} = \frac{180 - \text{margin}}{360 * d_{max}},$$

where margin is a preset phase margin in degrees, $d_{max}$ is the initial maximum delay error in seconds, $\Delta f_{MAX}$ is the initial maximum frequency spacing in Hz; and wherein a frequency spacing between any two phase responses of the initial usable phase response group is less than the initial maximum frequency spacing.

17. The signal delay estimating method of claim 15, wherein the method further comprising,
subtracting all phase responses of the initial usable phase response group with a value of a phase response of the initial usable phase response group, and
wherein the initial delay estimate is based on the subtracted phase responses of the initial usable phase response group.

18. The signal delay estimating method of claim 15, wherein the method further comprising,
wrapping each phase response of the initial usable phase response group to be within −180 and 180 degree range by adding to a value of the each phase response of the initial usable phase response group 360*n degrees, wherein n is an integer, and
wherein the initial delay estimate is based on the wrapped phase responses of the initial usable phase response group.

19. The signal delay estimating method of claim 15, wherein each phase response of the at least two of the extracted phase responses of the initial usable phase response group corresponds to a different frequency, and
the initial delay estimate is based on a slope and intercept estimate of the at least two of the extracted phase responses of the initial usable phase response group plotted on a graph of x-axis of frequencies and y-axis of degrees.

20. The signal delay estimating method of claim 15, wherein the updating of the extracted phase responses based on the initial delay estimate comprises updating each phase value of the extracted phase responses based on the equation below:

$$\theta(f) = \theta(f) - 360 * f * d_{est},$$

where $\theta(f)$ is a phase value of each of the extracted phase responses in degrees, and $d_{est}$ is the initial delay estimate.

21. The signal delay estimating method of claim 15, wherein the generating of the updated usable phase response group comprises,
generating an updated maximum frequency spacing based on an equation below:

$$\Delta f_{MAX} = \frac{180 - \text{margin}}{360 * d_{max}},$$

where margin is a preset phase margin in degrees, $d_{max}$ is the updated maximum delay error in seconds, $\Delta f_{MAX}$ is the updated maximum frequency spacing in Hz; and wherein a frequency spacing between any two phase responses of the updated usable phase response group is less than the updated maximum frequency spacing.

22. A signal delay estimating module comprising:
a tracker configured to track a channel response for each frequency of a plurality of frequencies;
an extractor coupled to the tracker and configured to extract a phase response for each frequency of a plurality of frequencies from the channel responses tracked by the tracker;
a phase response separator coupled to the extractor and configured generate a usable phase response group based on at least a subset of the extracted phase responses and a maximum delay error; and
a delay estimate generator coupled to the phase response separator and configured to generate a delay estimate based on a phase response of the usable phase response group.

23. The signal delay estimating module of claim 22, wherein the phase response separator is configured to determine a maximum frequency spacing based on the maximum delay error,
wherein a frequency spacing between any two phase responses of the usable phase response group, or between any phase response and a pivot phase response of the usable phase response group, is less than the maximum frequency spacing; and
wherein the phase response separator is further configured to maximize the frequency spacing.

24. The signal delay estimating module of claim 22, wherein the usable phase response group comprises an initial usable phase response group and an updated usable phase response group, and the maximum delay error comprises an initial maximum delay error and an updated maximum delay error,
wherein the phase response separator is configured to generate the initial usable phase response group, wherein the initial usable phase response group includes at least two of the extracted phase responses based on the initial maximum delay error;
wherein the delay estimate generator is configured to generate the initial delay estimate based on the initial usable phase response group;
wherein the phase response separator is further configured to update the extracted phase responses based on the initial delay estimate, generate the updated maximum delay error by updating the initial maximum delay error based on the initial delay estimate, generate the updated usable phase response group, wherein the updated usable phase response group includes at least one of the updated extracted phase responses and wherein the at least one of the updated extracted phase responses was not included in the initial usable phase response group;
wherein the delay estimate generator is further configured to generate the updated delay estimate based on the updated usable phase response group, and compare a quality metric of the updated delay estimate to a quality metric of the initial delay estimate; and wherein the updating of the extracted phase responses, maximum delay error, usable phase response group and delay estimate is repeated where the quality metric of the updated delay estimate is more improved than the quality metric of a previous delay estimate.

25. The signal delay estimating module of claim 22, wherein the phase response separator is further configured to subtract all extracted phase responses with a value of a phase response of the usable phase response group.

* * * * *